(12) United States Patent
Merchant et al.

(10) Patent No.: US 6,490,712 B1
(45) Date of Patent: Dec. 3, 2002

(54) METHOD AND SYSTEM FOR IDENTIFYING CONFIGURATION CIRCUIT ADDRESSES IN A SCHEMATIC HIERARCHY

(75) Inventors: James Daniel Merchant, Starkville, MS (US); Gordon Carskadon, Starkville, MS (US); Brian P. Evans, Starkville, MS (US); Jeffery Scott Hunt, Ackerman, MS (US); Anup Nayak, Fremont, CA (US); Andrew Wright, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 152 days.

(21) Appl. No.: 09/684,159

(22) Filed: Oct. 4, 2000

(51) Int. Cl.[7] .............................................. G06F 17/50
(52) U.S. Cl. .............................. 716/12; 716/17; 716/18
(58) Field of Search ................................ 716/12, 6, 18, 716/17, 19, 20; 326/38, 41, 40; 395/500.16

(56) References Cited

U.S. PATENT DOCUMENTS

| | | | | | |
|---|---|---|---|---|---|
| 6,009,252 | A | * | 12/1999 | Lipton | 716/1 |
| 6,107,821 | A | * | 8/2000 | Kelem et al. | 326/38 |
| 6,189,134 | B1 | * | 2/2001 | Weber | 716/12 |
| 6,230,301 | B1 | * | 5/2001 | Weber | 703/14 |
| 6,292,018 | B1 | * | 9/2001 | Kean | 326/39 |

* cited by examiner

Primary Examiner—Vuthe Siek
Assistant Examiner—Binh Tat
(74) Attorney, Agent, or Firm—Wagner, Murabito & Hao LLP

(57) ABSTRACT

A method and system for automatically identifying configuration cell addresses in a schematic hierarchy is disclosed. In one embodiment of the present invention, a memory cell (e.g., a configuration bit) is identified in a schematic hierarchy. Next, this embodiment determines an address for the memory cell. Then, this embodiment determines a unique name for the memory cell. The name is comprised of a hierarchical logical name and a schematic path name. By traversing the schematic and using logical names, all addresses of configuration bits of a circuit design may be automatically determined. The process is repeated for each memory cell in the schematic. This embodiment stores the unique name of the configuration bit and the address of the configuration bit in a data structure.

20 Claims, 16 Drawing Sheets

US 6,490,712 B1

METHOD AND SYSTEM FOR IDENTIFYING CONFIGURATION CIRCUIT ADDRESSES IN A SCHEMATIC HIERARCHY

FIELD OF THE INVENTION

Embodiments of the present invention relate to the field of programmable logic devices. Specifically, embodiments of the present invention relate to a system and method for identifying the addresses of configuration cells in a schematic hierarchy.

BACKGROUND ART

Integrated circuits, such as, for example, complex programmable logic devices (CPLD) comprise a large number and variety of programmable circuits. By selectively choosing which of the circuits on the CPLD are used and how the circuits are interconnected, a CPLD may be used to implement a wide range of custom circuit designs. Devices such as CPLDs have one or more arrays (e.g., configuration blocks) of memory cells (e.g., configuration bits) that configure the CPLD's functionality. Each of the memory cells (configuration bits) has an address which may be specified by a word-line and a bit-line. The configuration blocks are programmed at start-up by storing values into the configuration bits. The addresses of the configuration bits must also be determined for simulation. Due to the large number of configuration cells, the process of programming the configuration bits may be complex and problematic for complex PLDs.

In one conventional method, the memory cells (configuration bits) and their associated word-lines and bit-lines are identified manually, and the result would be specific to only one simulator. A separate computer program is written for each programmable logic device circuit design. Therefore, great care must be taken to avoid computer programming errors when using this cumbersome and tedious conventional method. Furthermore, each time the programmable logic device circuit design is changed, the program which identifies the memory cells and their associated word-lines and bit-lines must be changed, by once again manually identifying the wordline and bitline addresses of the configuration bits. Configuration bit errors due to manual entry mistakes may appear as circuit errors, thereby adding to the complexity and difficulty of circuit simulation.

As the complexity of devices such as CPLDs increases, the number of memory cells (configuration bits) increases. Consequently, the risk of error increases when using a conventional manual method for address determination. Furthermore, as separate programs need to be written for each programmable logic device design change, the time spent programming increases dramatically. Clearly, this could delay getting a new product to market and increase design and test costs.

SUMMARY OF THE INVENTION

Therefore, it would be advantageous to provide a method and system for automatically identifying configuration circuit addresses in a schematic hierarchy. A method and system are needed which automatically build a data structure comprising configuration circuit addresses from a programmable logic device design. A further needs exists for a such method and system which may easily update the output data structure when changes are made to the input schematic database. A still further need exists for such method and system which avoids the need for custom computer programs for each design and may function across a wide spectrum of applications.

Embodiments of the present invention provide a method and system for automatically identifying configuration cell (circuit) addresses in a schematic hierarchy of a programmable logic device design. Embodiments of the present invention provide for a method and system which automatically builds a data structure comprising configuration circuit addresses, thus minimizing errors which may occur in a manual process. Embodiments of the present invention automatically update the output data structure when changes are made to the input database. Embodiments of the present invention are applicable to a wide range of applications including simulations and testings and avoid the need for custom computer code for each programmable logic device design. Embodiments of the present invention provide these advantages and others not specifically mentioned above but described in the sections to follow.

A method and system for automatically identifying configuration cell addresses in a schematic hierarchy is disclosed. In one embodiment of the present invention, a memory cell (e.g., a configuration bit) is identified in a schematic hierarchy. Next, this embodiment determines an address for the memory cell. Then, this embodiment determines a unique name for the memory cell. The name is comprised of a hierarchical logical name and a schematic path name. By traversing the schematic and using logical names, all addresses of configuration bits of a circuit design may be automatically determined. The process is repeated for each memory cell in the schematic. This embodiment stores the unique name of the configuration bit and the address of the configuration bit in a data structure.

In one embodiment, the memory cell is at the lowest level in the schematic hierarchy. In another embodiment, the schematic hierarchy represents a complex programmable logic device (CPLD) design.

In another embodiment, in addition to the above steps, instance names in the hierarchical schematic are sorted alphanumerically. In yet another embodiment, in addition to the above steps, numerical indexes associated with logical names in the hierarchical schematic are renumbered.

In still another embodiment of the present invention, the wordlines and bitlines which are connected to a memory cell (e.g., a configuration bit) are traced to the corresponding wordlines and bitlines of a higher level cell in the schematic hierarchy.

DETAILED DESCRIPTION OF THE INVENTION

Figure 1A:
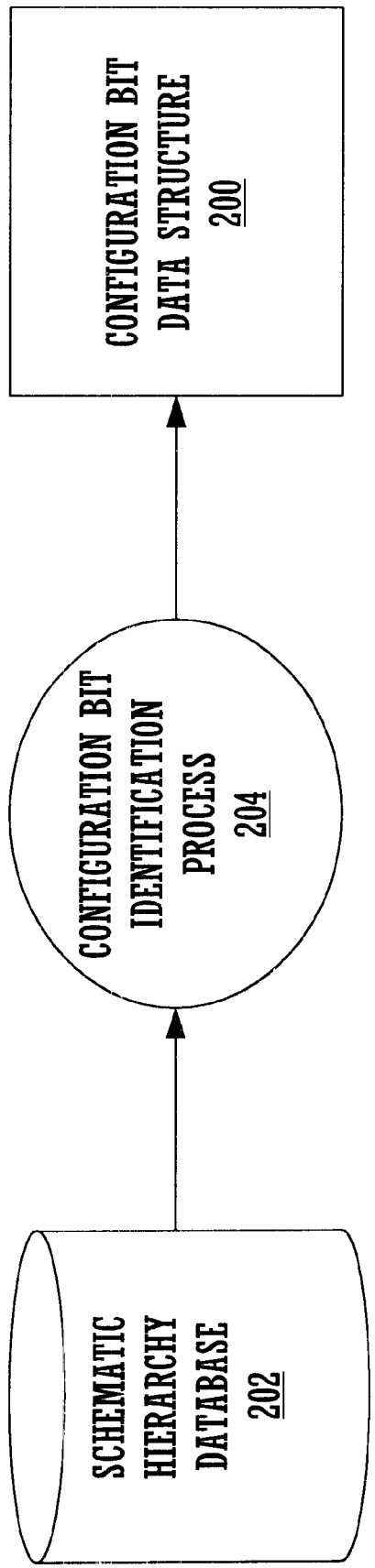
FIG. 1A is an diagram illustrating a schematic hierarchy database as input into an embodiment of the present invention which outputs a configuration bit data structure.

In the following detailed description of embodiments of the present invention, a method and system for automatically identifying configuration circuit addresses in a schematic hierarchy of a programmable logic device, numerous specific details are set forth in order to provide a thorough understanding of embodiments of the present invention. However, it will be recognized by one skilled in the art that embodiments of the present invention may be practiced without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "ordering" or "recognizing" or "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Identifying Configuration Circuit Addresses in a Schematic Hierarchy of a Programmable Logic Device Embodiments of the present invention provide for a method and system for automatically identifying configuration circuit addresses in a schematic hierarchy of a programmable logic device. An embodiment of the invention traverses the hierarchy of schematics in order to identify every configuration bit (e.g., the lowest memory cell) in the entire hierarchy. This embodiment uses the instance name to identify configuration bits and the logical hierarchy of configuration bits.

Referring to FIG. 1A, embodiments of the present invention, a configuration bit identification process 204, may be used to produce a configuration bit data structure 200 from a schematic hierarchy database 202. For example, the schematic hierarchy database 202 may reflect the circuitry of a programmable logic device, such as a complex programmable logic device (CPLD). However, the present invention is not limited to using a schematic database 202 which represents a CPLD. The schematic hierarchy database 202 may be constructed by using any suitable software program, as will be well understood by those of ordinary skill in the art. For example, commercially available software from Cadence Design Systems, Inc. San Jose, Calif. may be used to build the schematic database 202. Embodiments of the present invention may operate on any level of the schematic hierarchy 202. An embodiment of the present invention performs the steps of traversing a schematic hierarchical database 202 and identifying the hierarchical logical name of a configuration bit, the schematic path name to the configuration bit, and wordline and bitline addresses of the configuration bit.

Figure 1B:
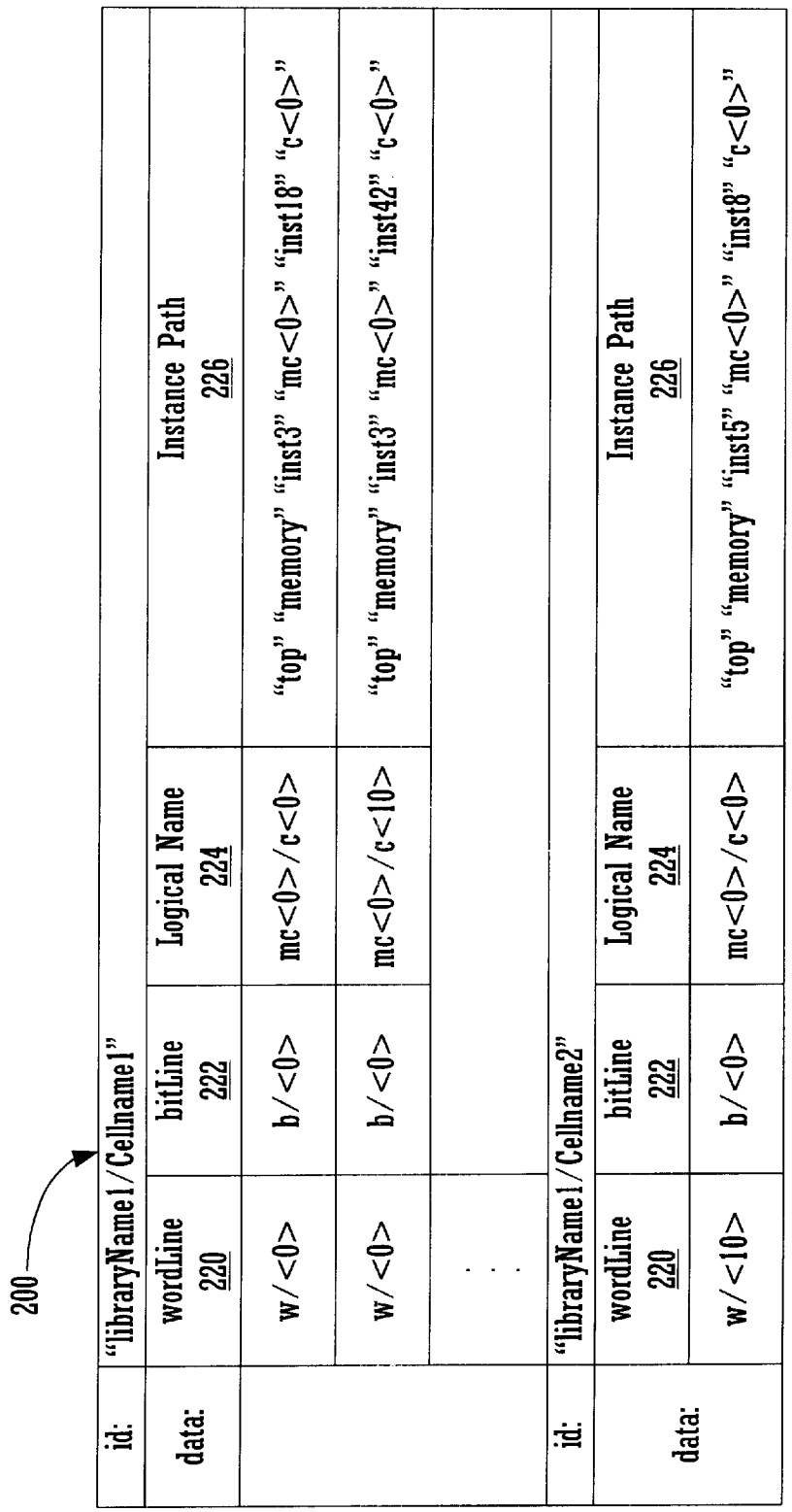
FIG. 1B illustrates an exemplary configuration bit data structure, which is the output of an embodiment of the present invention.

The output configuration bit data structure 200 of one embodiment is illustrated in FIG. 1B. Data structure 200 contains a configuration bit data structure entry for each library name and cell name that was traversed by this embodiment of the invention. For each library/cell combination (e.g., LibraryName1/CellName1) there is a list of the configuration bits that are contained in the schematic database 202.

Still referring to FIG. 1B, for example, a configuration bit (memory cell) is known by its wordline 220, its bitline 222, its logical name 224, and the schematic instance path 226 down to the configuration bit memory cell. Together, the bitline 222 and wordline 220 define the address of the configuration bit.

Figure 2A:
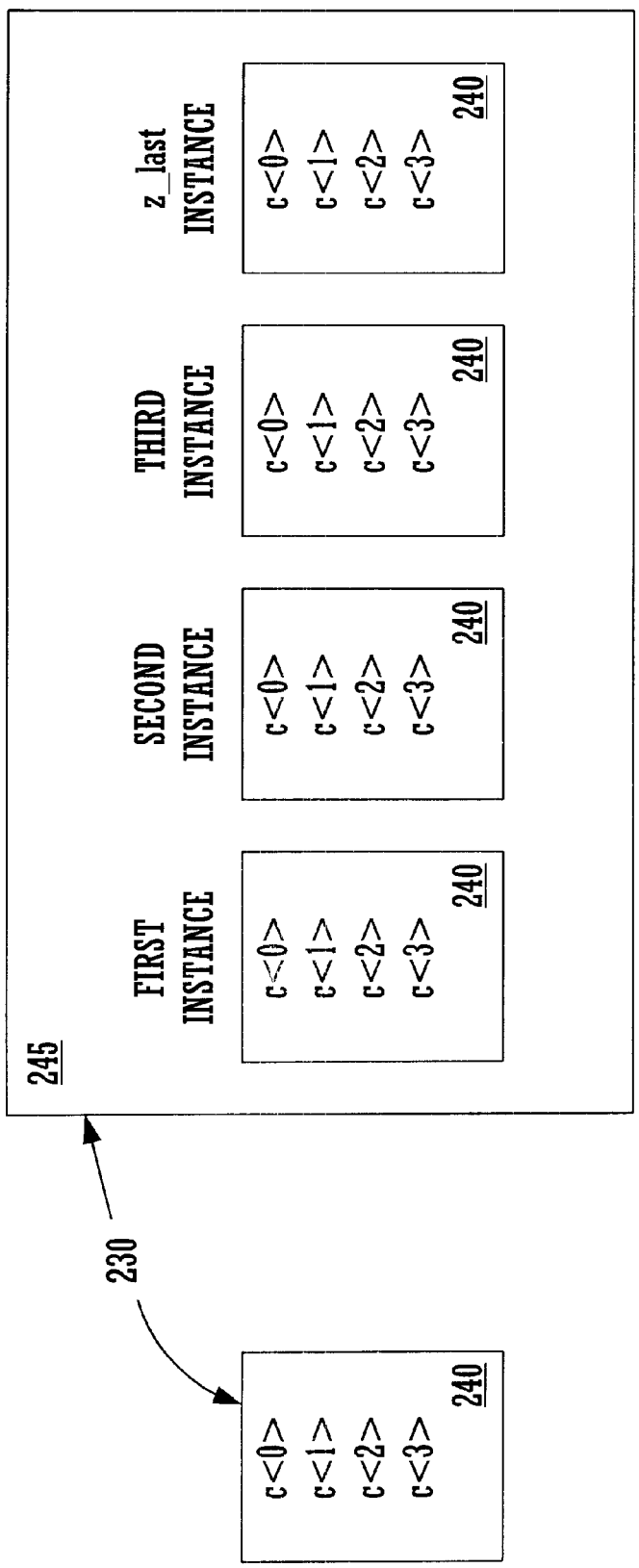
FIG. 2A, FIG. 2B, FIG. 2C, FIG. 2D, and FIG. 2E are diagrams illustrating an example of renumbering configuration bits and other logical units, according to embodiments of the present invention.

An embodiment of the present invention renumbers logical units as a part of the process. FIG. 2A contains a diagram representing examples of cells 230, which contain instances of logical units, for example, configuration bits 235, macro cells 240, and logical blocks 245. These logical units may represent physical circuits which perform a logical function. Every logical unit has a numerical index associated with it. For example, the configuration bits 235 are numbered c<0>, c<1>, c<2>, and c<3>. The other logical units also have numerical indexes; however, they are not shown in FIG. 2A. A logical unit may be numbered by an instance name with a logical unit name and bus syntax (e.g., mc<3:0>). A logical unit may be numbered by instance name with a logical unit name and _# suffix (e.g., mc_3). Additionally, configuration bits may be numbered by instance names such as C# (e.g., C4). A configuration bit 235 is a memory cell containing one bit of data and is at the lowest level of the logical hierarchy of the schematic database 202. Each configuration bit 235 has one wordline and one bitline (not shown) connected to it. Additionally, each of the higher level cells (e.g., a macro cell 240 or logical block 245) has at least one bitline and at least one wordline connected to it (not shown).

An understanding of bus expansion of instance names is important. When an embodiment hits an iterated instance, it will expand the instances in the order specified by the bus syntax. For example, if an instance is named "foo<0:7>", this embodiment will expand the configuration bits 235 for foo<0>, then <1>, etc., up to <7>. If it is named "foo<7:0>", this embodiment will expand the configuration bits 235 for foo<7>, then foo<6>, etc., down to foo<0>.

In this embodiment, the above instance naming convention must be followed for every logical unit and avoided for everything that is not a logical unit. For illustrative purposes, the following is an exemplary list of logical unit names for those cells and their logical hierarchy which contain configuration bits 235.

cl—Cluster
    lbp—cluster logic block input pim
        lbpmx—logic block pim mux
    crp—cluster ram input pim
        """"—cluster ram pim stage 1
            crp1mx—cluster ram pim stage 1 mux
        """"—cluster ram pim stage 2
            crp2mx—cluster ram pim stage 2 mux
    lb—cluster logic blocks
        ptck—clock product term
        ptrs—set-reset product term
        pt—product term
        ptm—ptm
        mc—macro cell
        srptmx—set—reset product term mux
    crcfg—cluster memory configuration bit
cr—cluster ram
    crcore—cluster memory core bit
ch—channel
    h2clp—hor channel to cluster pim
        """"—hor channel to cluster pim stage 1
            h2clps1mx—hor channel to cluster pim stage 1 mux
        """"—hor channel to cluster pim stage 2
            h2clps2mx—hor channel to cluster pim stage 2 mux
    h2vp—hor channel to vertical channel pim
        """"—hor channel to vertical channel pim stage 1
            h2vps1mx—hor channel to vertical channel pim stage 1 mux
        """"—hor channel to vertical channel pim stage 2
            h2vps2mx—hor channel to vertical channel pim stage 2 mux
    h2cmp—hor channel to channel memory pim
        """"—hor channel to channel memory pim stage 1
            h2cmps1mx—hor channel to channel memory pim stage 1 mux
    h2ip—hor channel to io pim
        """"—hor channel to io pim stage 1
            h2ips1mx—hor channel to io pim stage 1 mux
        """"—hor channel to occ io pim
            h2ips2mx—hor channel to occ io pim mux
    v2clp—vert channel to cluster pim
        """"—vert channel to cluster pim stage 1
            v2clps1mx—vert channel to cluster pim stage 1 mux
        """"—vert channel to cluster pim stage 2
            v2clps2mx—vert channel to cluster pim stage 2 mux
    v2hp—vert channel to horizontal channel pim
        """"—vert channel to horizontal channel pim stage 1
            v2hps1mx—vert channel to horizontal channel pim stage 1 mux
        """"—vert channel to horizontal channel pim stage 2
            v2hps2mx—vert channel to horizontal channel pim stage 2 mux
    v2cmp—vert channel to channel memory pim
        """"—vert channel to channel memory pim stage 1
            v2cmps1mx—vert channel to channel memory pim stage 1 mux
        """"—vert channel to channel memory pim stage 2
            v2cmps2mx—vert channel to channel memory pim stage 2 mux
    v2ip—vert channel to io pim
        """"—vert channel to io pim stage 1
            v2ips1mx—vert channel to io pim stage 1 mux
        """"—vert channel to io pim stage 2
            v2ips2mx—vert channel to io pim stage 2 mux
    """"—cluster to vert channel output pim
        cl2vpmx—cluster to vert channel output pim mux
    """"—cluster to hor channel output pim
        cl2hpmx—cluster to hor channel output pim mux
    cmcfg—channel memory config bits
cm—channel memory
    cmcore—channel memory core
iob—IO block
    iocell—IO cell
cb—control block
    usercode—user code
    pllclkmux—pll and clock mux
    misc—misc bits for future use
    vreg—voltage regulator Referring to FIG. 2A, a re-numbering example will be discussed. FIG. 2A illustrates cells 230, which contain instances of macro cells 240 and configuration bits 235. Each macro cell 240 contains four configuration bits 235 numbered c<0>, c<1>, c<2>, and c<3>. The single logic block 245 contains four separate instances of macro cell 240.

Still referring the FIG. 2A, the four separate instances of macro cell 240 are named first, second, third and z_last. The instance names should be provided in the schematic database 202. An embodiment of the present invention will sort alphanumerically the instance names which were provided. Because it would be nonsensical for there to be four c<0> configuration bits 235 in logic block 245, an embodiment of the present invention will renumber the configuration bits 235 as illustrated in FIG. 2B.

Figure 2B:
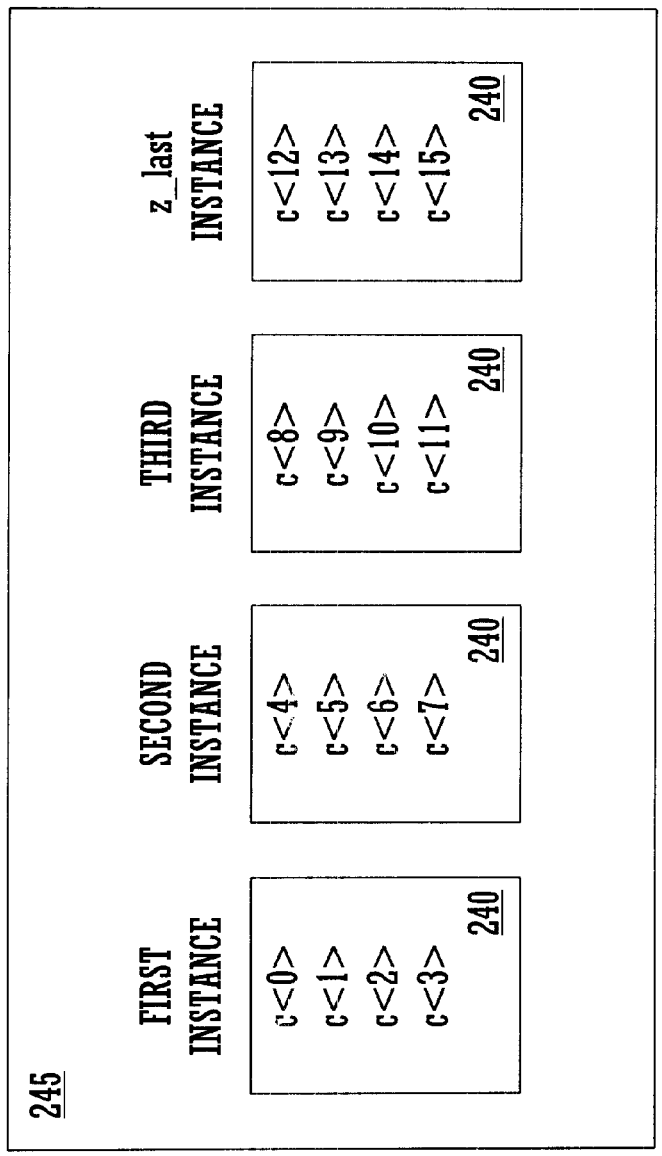

Referring to FIG. 2B, the configuration bits 235 are renumbered c<0> through c<15> based upon the alphanumeric sort of the instance names. Then, this embodiment will sort the instances in some fashion, for example alphanumerically. Finally configuration bits 235 are re-numbered. Thus, the second instance of macro cell 240 has its configuration bits 235 renumbered from c<4> through c<7>. The third instance of macro cell 240 has its configuration bits 235 renumbered from c<8> through c<11>. The final instance of macro cell 240 has its configuration bits 235 renumbered from c<12> through c<15>.

Figure 2C:
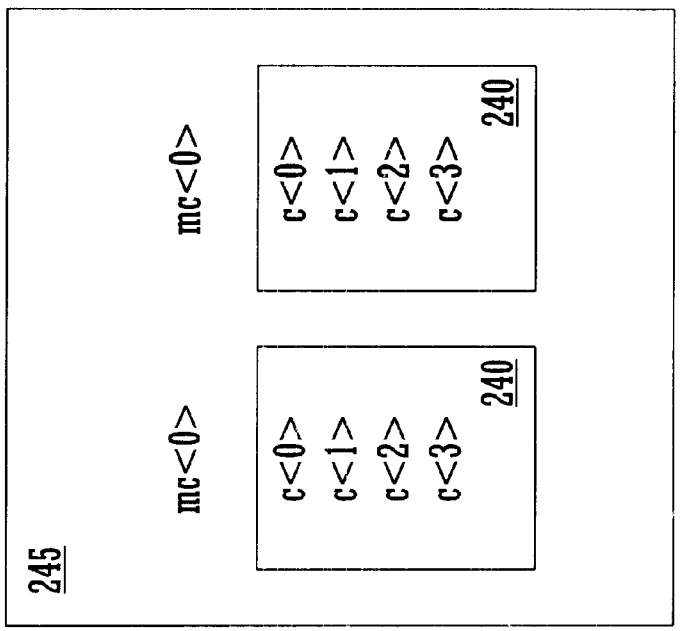
Figure 2C:
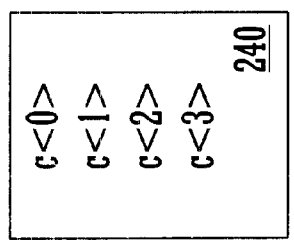

FIG. 2C illustrates a more complex example of renumbering logical units. FIG. 2C contains macro cell 240 much like the one in FIG. 2A. The logic block 245 contains two instances of macro cell 240. However, unlike the previous example, in this example the two instances represent new logical units of configuration bits 235. Therefore, the numbering of the configuration bits 235 in logic block 245 is mc<0>/c<0> through mc<0>/c<3> for the first instance of macro cell 240 within logic block 245. For the second instance of macro cell 240, the numbering is mc<1>/c<0> through mc<1>/c<3> (for example, macro cell one, configuration bit three).

Figure 2D:
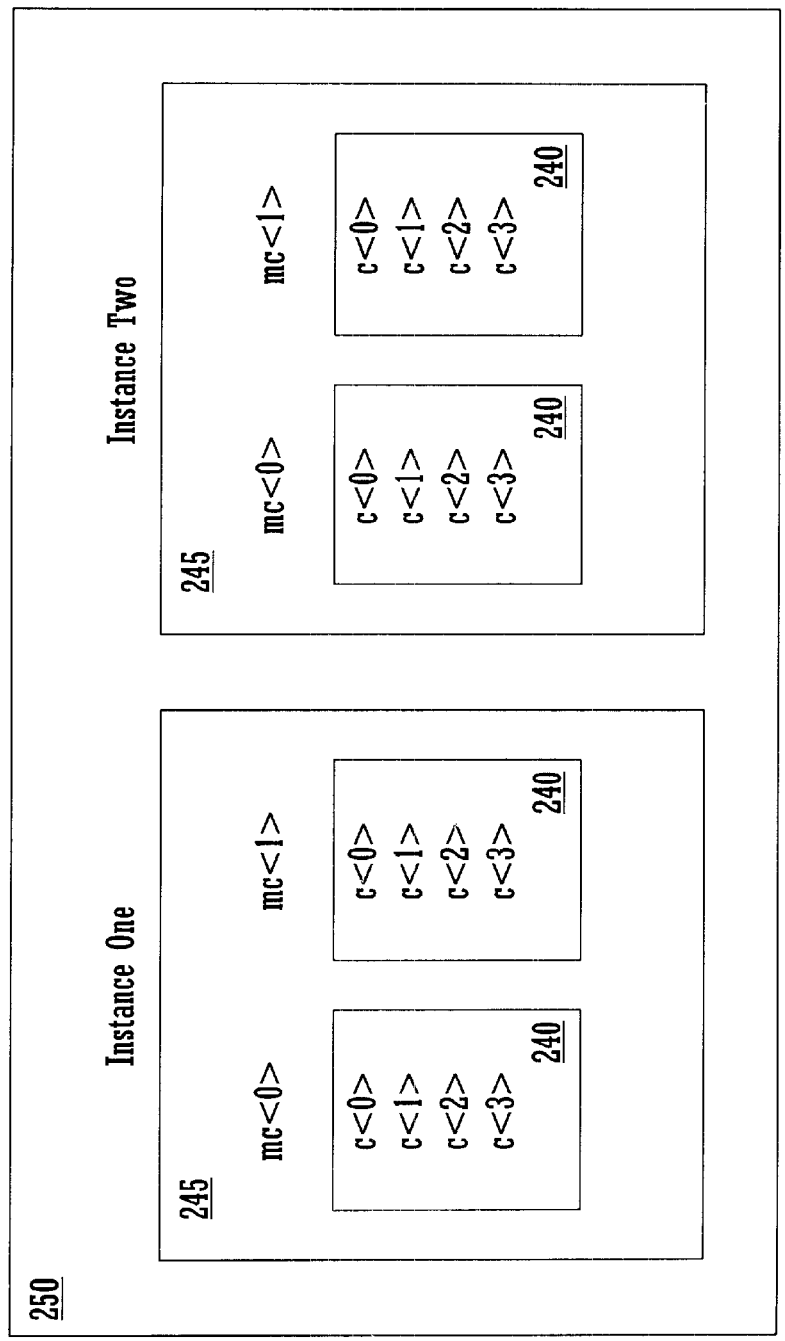

Referring now to FIG. 2D, an example is shown with a cell labeled as a C cell 250. The C cell 250 contains two separate instances of logic block 245. In this case, the two separate instances of logic block 245 do not represent new logical units. Therefore, an embodiment of the present invention will alphanumerically sort the two instances of logic block 245. For example, it will sort them as instance one and instance two. Then, the macro cells 240 in this example are re-numbered, as shown in FIG. 2E.

Figure 2E:
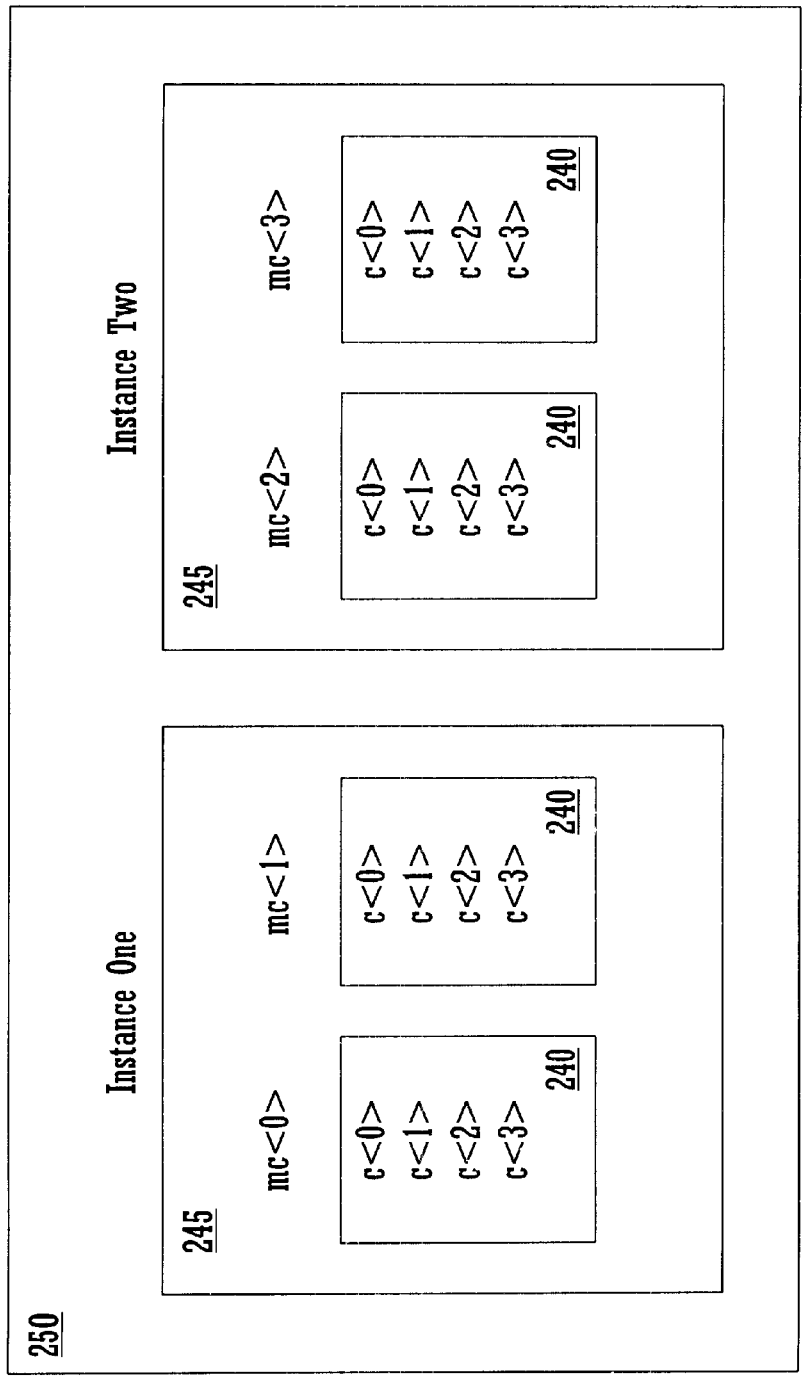

Referring to FIG. 2E, the macrocells (mc) for instance two for the logic block 245, have been renumbered to mc<2> and mc<3>. However, the configuration bits 235 are not renumbered.

The Configuration Bit Memory Cell

The lowest level in the hierarchy is a memory cell for a configuration bit 235. In one embodiment, the word line and bit line for the memory cell need to follow a naming convention. The word line needs to be named either "cfgwl", "wl", or "lwl". The bit line needs to be named either "cfgbl", "bl", or "lbl". This embodiment will trace up the word lines and bit lines hooked up to the configuration bit memory cells 235.

In this embodiment, the memory cell schematic should have a transistor that has the word line hooked up to the gate and the bit line hooked up to the source/drain. This embodiment will find the node to set by finding the net on the opposite source/drain as the bit line. This net should always be a pin in the memory cell. However, for Hspice netlists, it requires a local net, not a pin, be connected to this memory cell pin. The net one level up should never be a pin; it should always be an internal net.

The Configuration Block

In one embodiment, the configuration blocks follow a naming convention for its word lines and bit lines. The configuration block definition file will determine the actual word line and bit line terminal names. This is not a hard requirement because the cluster ram and channel memory do not have word lines and bit lines at the top level. In those cases, care must be taken to ensure that the word lines and bit lines that this embodiment makes up configure the bits in the correct order.

As this embodiment descends through the schematic hierarchy 202 for a configuration block, this embodiment will not descend into another configuration block. For example, the cluster ram is a configuration block. However, the cluster ram is placed inside of a cluster. When this embodiment identifies all of the configuration bits for a cluster, this embodiment will not descend into the cluster ram schematics.

Identifying the Word Lines and Bit Lines

In one embodiment, the word lines and bit lines are represented as a RC network in the schematics. In many cases, there will be an input pin and an output pin, such as "cfgwlin" and "cfgwlout", in each schematic. Although conceptually "cfgwlin" is the same word line as "cfgwlout", the actual nets are different. This embodiment is careful not to artificially double the number of bit lines or word lines in a cell, by having some of the configuration bits 235 connected to the "in" variant and the others connected to the "out" variant.

Whenever this embodiment sees a symbol that has two pins that are only different by "in" and "out" in their names, such as "cfgwlin" and "cfgwlout", it assumes that the two are really connected together and are only separated out to more accurately model the RC network. As this embodiment traces the bit lines and word lines up, it will always try to go with the "in" variant of the pin name.

Providing Word Lines and Bit Lines

In one embodiment, there are certain cases in which the word lines and bit lines do not go to the top level of the configuration block. Two exemplary cases are the cluster ram and channel memory. For this embodiment to work optimally, each configuration bit 235 must be associated with a word line and bit line.

If this embodiment finds a configuration bit 235 in a cell which does not have a word line and a bit line connected which are pins, it will assume that all of the configuration bits 235 in that cell are likewise, and it will make up word lines and bit lines for all of them.

The lowest level cell that does not have word lines or bit lines as pins will have one word line that is named "wlAss<0>". It will have one bit line for each configuration bit 235, starting from 0, with the names "blAss<0>", "blAss<1>", . . .

At the each level up, every instance will get one word line, "wlAss<#>", and all of the configuration bits 235 for that instance will be on a different bit line starting with "blAss<0>".

Figure 3A:
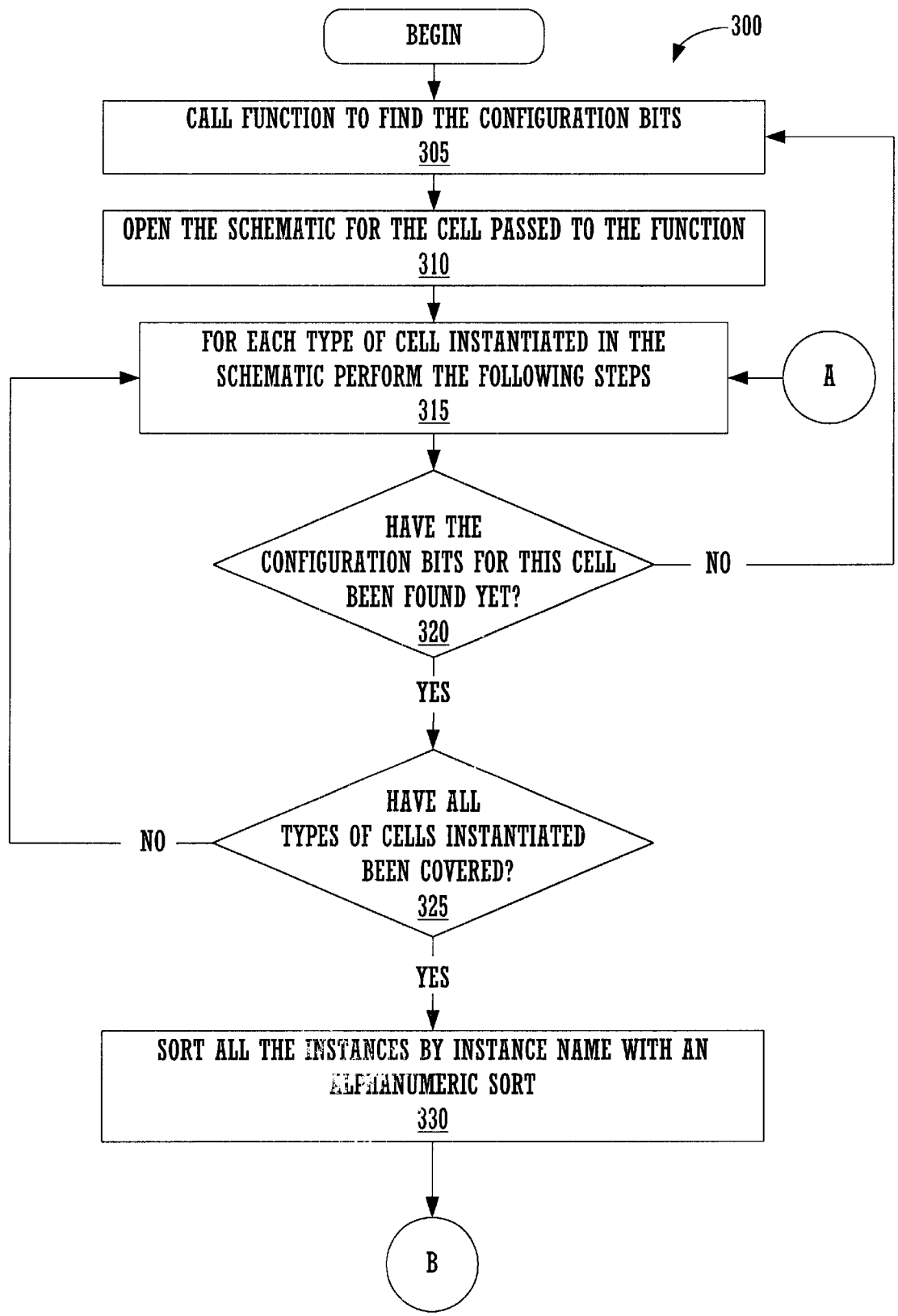
FIG. 3A, FIG. 3B, FIG. 3C, and FIG. 3D are flowcharts illustrating the process of steps of creating a configuration bit data structure, according to an embodiment of the present invention.

Referring now to FIG. 3A, steps of an embodiment of the present invention are shown illustrating the process 300 of identifying configuration circuit addresses in a schematic hierarchy 202. The process 300 may be realized as instruction code stored in computer readable memory units and executed by a processor. In step 305, a call is made to a function to find the configuration bits 235 in a schematic hierarchy 202. While this embodiment refers to finding configuration bits 235, it will be understood that the configuration bit 235 may be a memory cell containing a single bit of information. The input to the function is one cell 230 of the schematic hierarchy 202. For example, the C cell 250 from FIG. 2E may be passed in. The C cell 250 passed in may represent a physical circuit within the schematic hierarchy 202. As many physical circuits are repeated many time within the schematic hierarchy 202, there may be multiple. instances of a given cell 250.

In step 310 the schematic for the C cell 250 that was passed into the function is opened. In step 315, a series of steps is begun for each type of cell 230 (e.g., each type of logical unit, such as a macro cell or logical block) which is instantiated in the schematic for the C cell 250 which was passed in to the function. For example, referring to FIG. 2E, C cell 250 contains two instances of logic block 245. Thus, in this example, one type of cell 230 is instantiated within cell C 250. Clearly, cell C 250 could contain other types of cells 230 at the same hierarchical level as the logic blocks 245, as well.

In step 320, the process 300 determines whether the configuration bits 235 have been found yet for the cell 230 which was instantiated within the schematic for the C cell 250 which was passed in to the function. The process 300 may make this determination by testing whether the function has been called yet with this type of cell 230. In this example, this would be the logic block type cell 245. If not, the function is recursively called. This call passes to the function the cell 230 which is instantiated within the schematic of the cell 230 which as just opened on this call to the function. In this example, a logic block type cell 245 is passed to the function.

Steps 305 through 325 are repeated until, the process 300 determines that the configuration bits 235 are found for each type of cell 230 which is instantiated down to the lowest level of the hierarchy with the original cell passed in. For example, the process 300 will eventually find the configuration bits 235 within the macro block type cell 240 in FIG. 2E. In summary, for this example there are three cell types: C, logic block, and macro cell (250, 245, 240) in descending order in the hierarchy. The process 300 does not need to open the schematic for each instantiation of a given cell type, (e.g., logic block, macro cell, or C) because the contents of that cell 230 will be the same as for others of that cell type.

In step 330, the process 300 sorts all of the instance names with an alphanumeric sort. For example, referring to FIG. 2E, logic block 245 has instance one and instance two. These two cells 230 are sorted in this order, in this step. Or, referring to FIG. 2B, each instantiation of macro cell 240 within logic block 245 is sorted in the order, first, second, third, and z_last. However, the present invention is not limited to this sort method; any convenient type of sort may be used, in other embodiments.

Figure 3B:
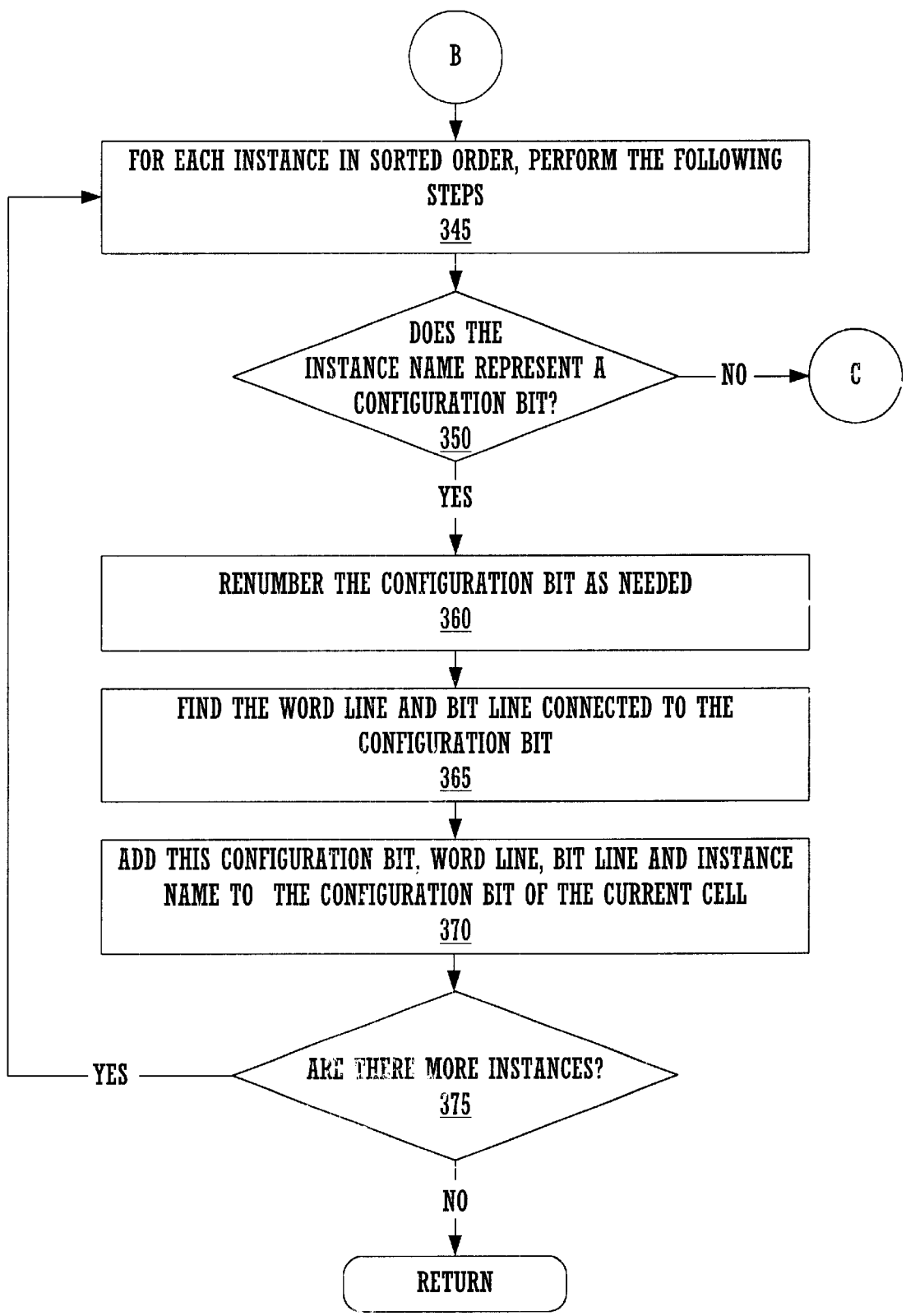

The process 300 continues in FIG. 3B by performing a series of steps for each instance in sorted order, in step 345. In step 350, the process 300 determines whether the instance name represents a configuration bit 235, e.g., the lowest memory cell in the hierarchy. If it does represent a configuration bit 235, then the process 300 renumbers the configuration bit 235 as needed, in step 360. FIG. 2A–FIG. 2E illustrate further details of a renumbering process.

Next, in step 365, the process finds the wordline and the bitline connected to this configuration bit 235. Each configuration bit 235 has one such wordline and one such bitline connected to it. These lines may be used to specify the configuration bit's address. For example, a CPLD may have a number of configuration blocks, each block with an array of configuration bits 235. One axis of the array corresponds to the bitline, the other to the wordline. Each configuration bit 235 has a unique address in one of these configuration block arrays.

Next, in step 370, the process 300 adds the logical name of the configuration bit 235, the wordline and bitline addresses of the configuration bit 235, and the instance name to the data structure 200 of configuration bits 235 of the current cell, for example, the cell 230 which was passed in to the function. In this fashion, this embodiment builds up a data structure 200 which identifies circuit addresses of a schematic hierarchy 202.

In step 375, the process 300 determines whether there are more instances in the sorted order of instances from step 345. If there are, steps 350 through 370 are repeated. When there are no more instances for the cell 230 which was passed into the function, the process returns. Thus, the recursive process may then traverse back up the hierarchy 202 to operate on a cell 230 at a higher level.

Figure 3C:
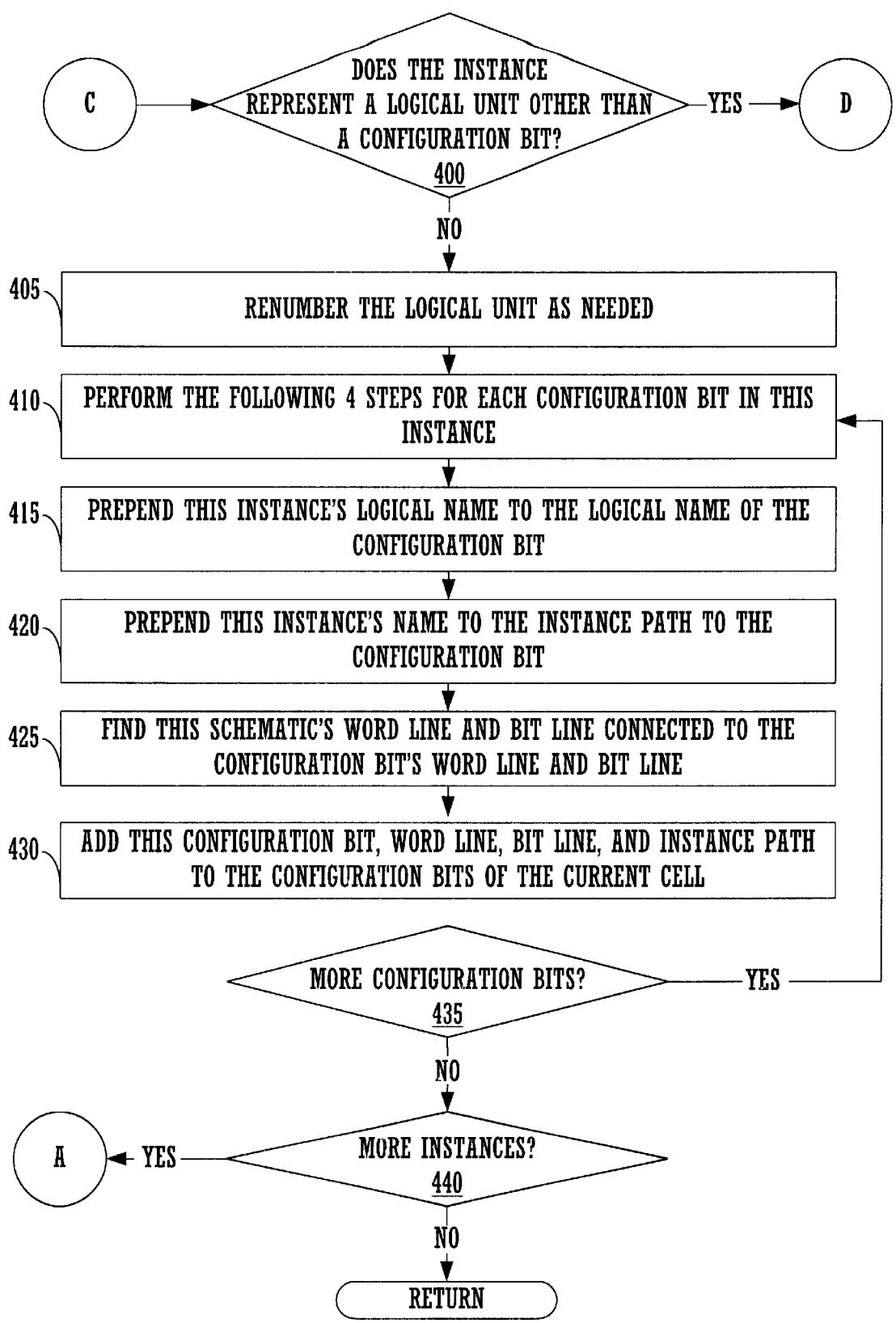
Figure 3D:
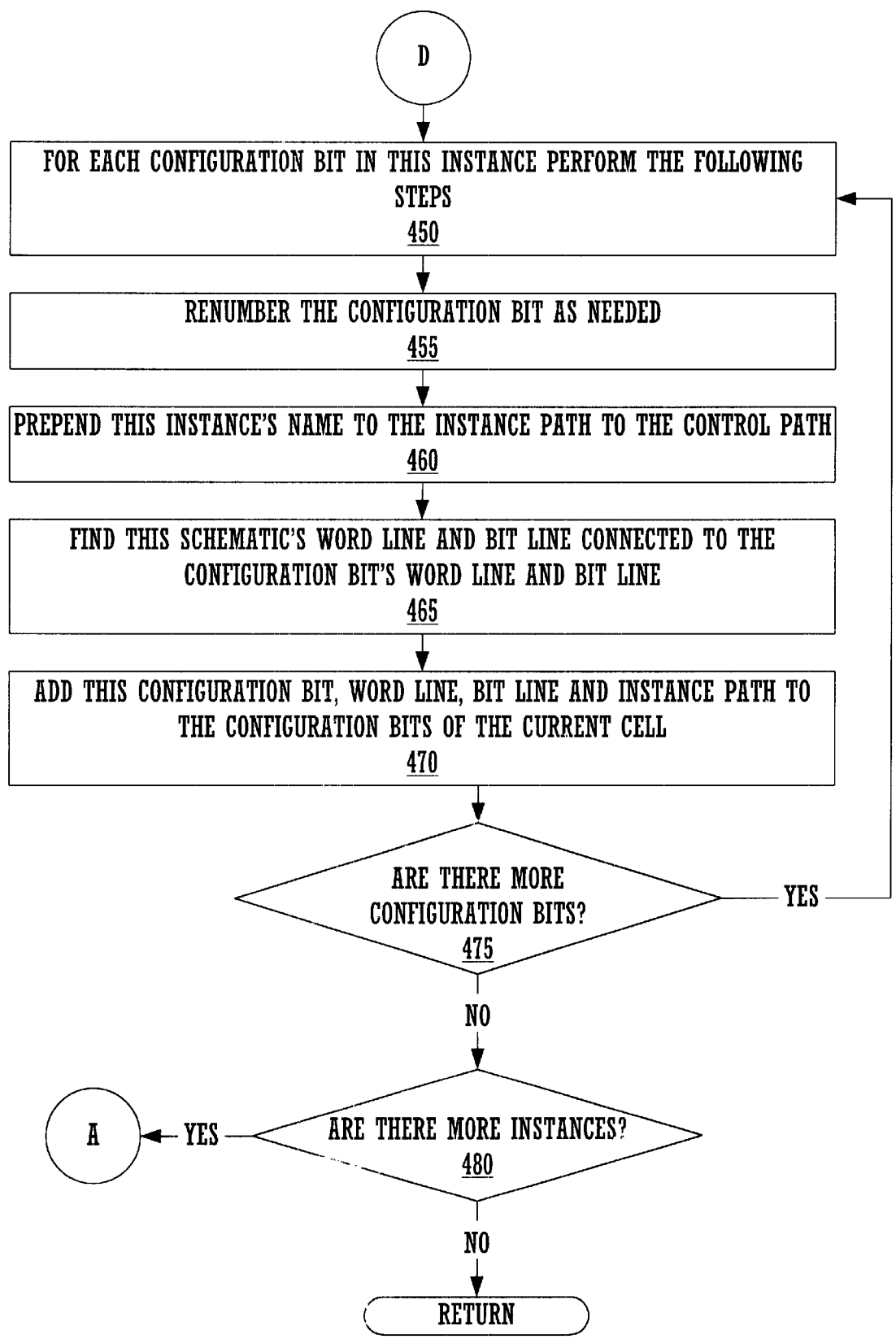

If the process determines, in step 350, that the instance name does not represent a configuration bit 235, then the process continues in FIG. 3C. In step 400, the process 300 determines whether the instance represents a logical unit other than a configuration bit 235. For example, the logical unit may be a macro cell 240 or a logic block 245. One embodiment checks a list of logical unit names to determine whether the instance name is a logical unit. If the process 300 determines that this is the case, the logical unit is renumber as needed, in step 405. The renumbering of the logical unit proceeds as shown in FIG. 2A–FIG. 2E.

Next, in step 410, the process performs a series of steps for each configuration bit 235 within the instance. In step 415, the process 300 prepends the instances logical name to the logical name of the configuration bit 235. For example, mc<0>may be prepended to c<0> to form mc<0>/c<0>.

In step 420, the process 300 prepends the instance's name to the instance path to the configuration bit 235. For example, "inst3" "mc<0>" may be prepended to "inst18" "c<0>" forming "inst3" "mc<0>" "inst18" "c<0>". In this fashion, a instance path down the schematic hierarchy 202 to the configuration bit 235 (memory cell) is constructed.

In step 425, the process 300 finds the schematic's wordline and bitline connected to the configuration bit's wordline and bitline. In step 430, the process 300 adds the configuration bit's logical name, its wordline and bitline addresses, and the instance path to the configuration bit 235 to the data structure of configuration bits 200 of the current cell, for example, the cell which was passed in to the function.

Next, in step 435 the process 300 determines if there are more configuration bits 235 in this instance, and if so repeats steps 415 through 430 until there are no more configuration bits 235 in this instance.

In step 440, the process 300 determines if there are more instances in this cell. If so, the process repeats step 345 for the next instance in the sorted order for this cell. When there are no more instances, the process returns and the recursively called function may operate on the next cell.

If the determination in step 400 determines that the instance did not represent a logical unit other than a configuration bit 235, then the process continues in FIG. 2D. In step 450, the process 300 begins a series of steps for each configuration bit 235 in the instance. In step 455, the process renumbers the configuration bit 235 as needed.

In step 460, the process prepends this instance's name to the instance path to the configuration bit 235. In this fashion, when finished, the process 300 is able to trace a path from the highest level of the schematic hierarchy 202 down to each specific configuration bit 235.

In step 465, the process 300 finds the wordline and the bitline for the schematic for this instance which is connected to the wordline and the bitline of this configuration bit 235. Then, in step 470, the process 300 adds this configuration bit's logical name, the configuration bit's wordline and bitline addresses, and the instance path to the configuration bit 235 to the configuration bit data structure 200 along with the rest of the information for this cell.

In step 475, the process 300 determines if there are more configuration bits 235 for this instance, and if so repeats step 450 through step 470. When the process 300 has handled all configuration bits 235 for this instance, the process 300 checks to see if there are more instances, in step 480. If there are more instances, the process repeats step 345 for the next instance in the sorted order for this cell. When there are no more instances, the process returns and the recursively called function may operate on the next cell up the schematic hierarchy 202. Eventually, the entire schematic hierarchy is traversed and the data structure 200 containing the configuration bit addresses is complete. In another embodiment, the traversal is run on only a portion of the schematic hierarchy 200.

The following is exemplary pseudocode for the process 300 of FIGS. 3A–3D.

function findConfigBits (cell)
    open the schematic for the cell
    for each type of cell instantiated in the schematic
        if it has not yet found the configuration bits for the cell
            that is instantiated

```
            recursively call findConfigBits for the cell that is
                instantiated
            end if
        end for each
        sort all of the instances by instance name with an alpha-
            numeric sort
        for each instance in sorted order
            if the instance name represents a configuration bit
                renumber the configuration bit as needed
                find the word line and bit line connected to the
                    configuration bit
                add this config bit, word line, bit line, and instance
                    name to the config bits of the current cell
            else if the instance name represents a logical unit other
                    than a configuration bit
                renumber the logical unit as needed
                for each configuration bit in this instance
                    prepend this instances logical name to the logical
                        name of the config bit
                    prepend this instance name to the instance path to
                        the config bit
                    find this schematic's word line and bit line con-
                        nected to the configuration bit's word line and
                        bit line
                    add this config bit, word line, bit line, and
                        instance path to the config bits of the current
                        cell
                end for each
            else
                for each configuration bit in this instance
                    renumber the configuration bit as needed
                    prepend this instance name to the instance path to
                        the config bit
                    find this schematic's word line and bit line con-
                        nected to the configuration bit's word line and
                        bit line
                    add this config bit, word line, bit line, and
                        instance path to the config bits of the current
                        cell
                end for each
            end if
        end for each
    end function findConfigBits
```

FIG. 4 illustrates the steps of a process 500 of identifying circuit addresses in a schematic hierarchy when the wordlines and bitlines are known in advance. Process 500 is similar to the embodiment of process 300. Process 500 begins, in step 505, with a function call, passing in not only the cell, but also the names of the wordlines and bitlines. In step 510, the schematic for the cell passed in to the function is opened.

In step 515, process 500 finds all instances that are connected to the wordlines and bitlines which were passed in to the function. Next, in step 520, a series of steps is begun for each type of cell 230 instantiated in the schematic which is connected to the wordlines and the bitlines.

In step 525, the process 500 determines whether all configuration bits 235 have been found for this cell 230. If not, the process repeats steps 510 though 525 until all configuration bits 235 have been found.

Figure 4A:
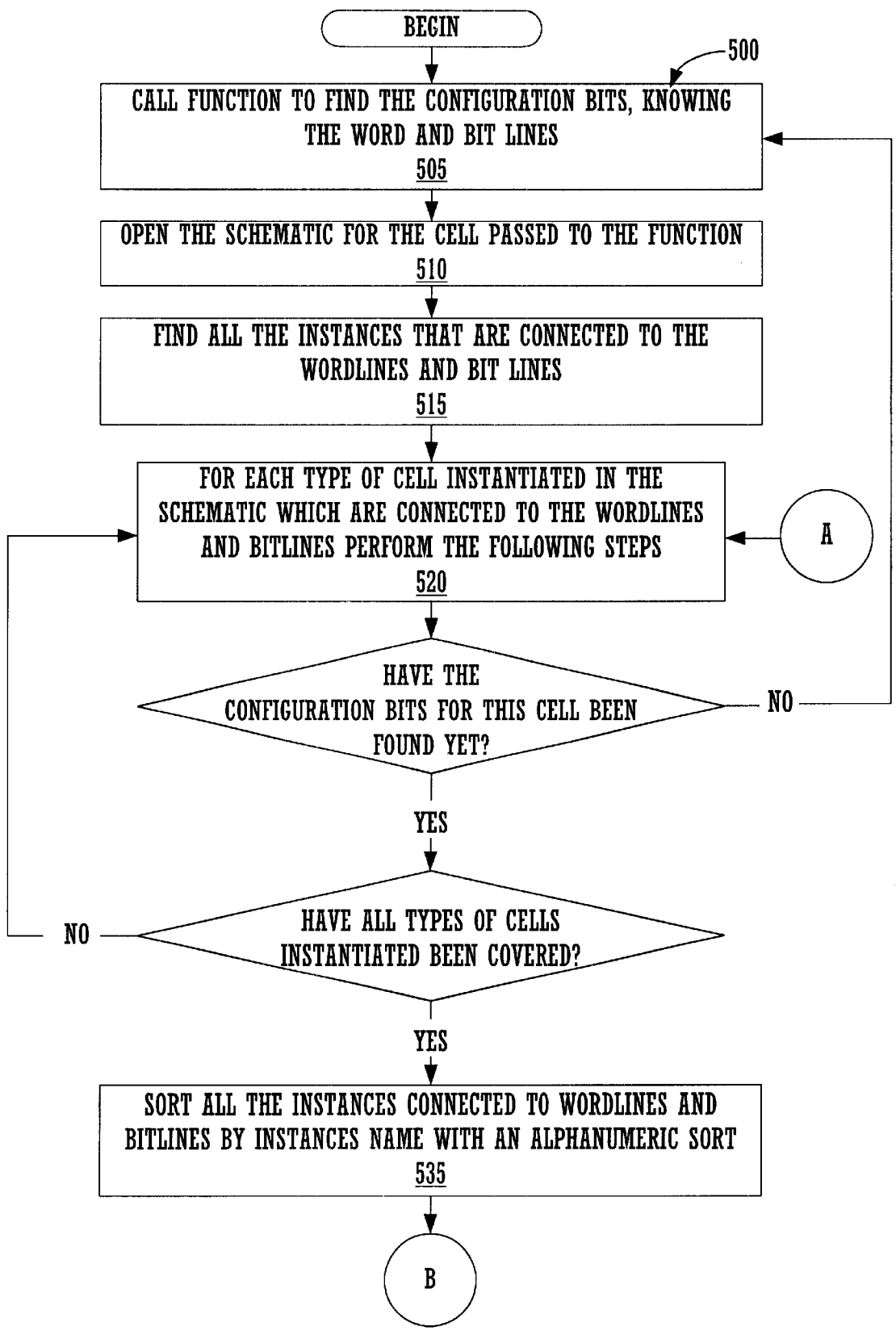
FIG. 4A, FIG. 4B, FIG. 4C, and FIG. 4D are flowcharts illustrating the process of steps of creating a bit order file when the names of the wordlines and bitlines are known in advance, according to an embodiment of the present invention.
Figure 4B:
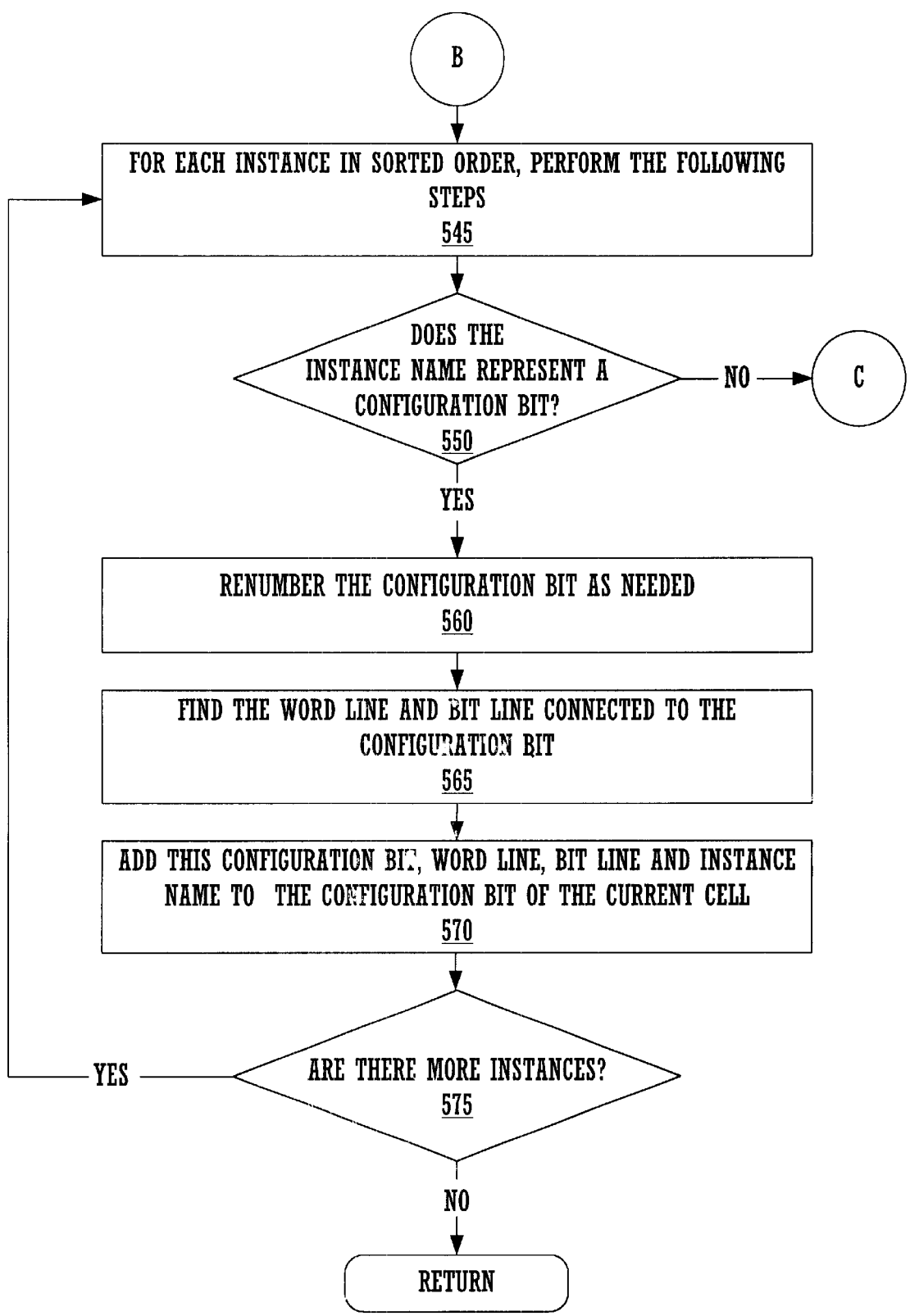
Figure 4C:
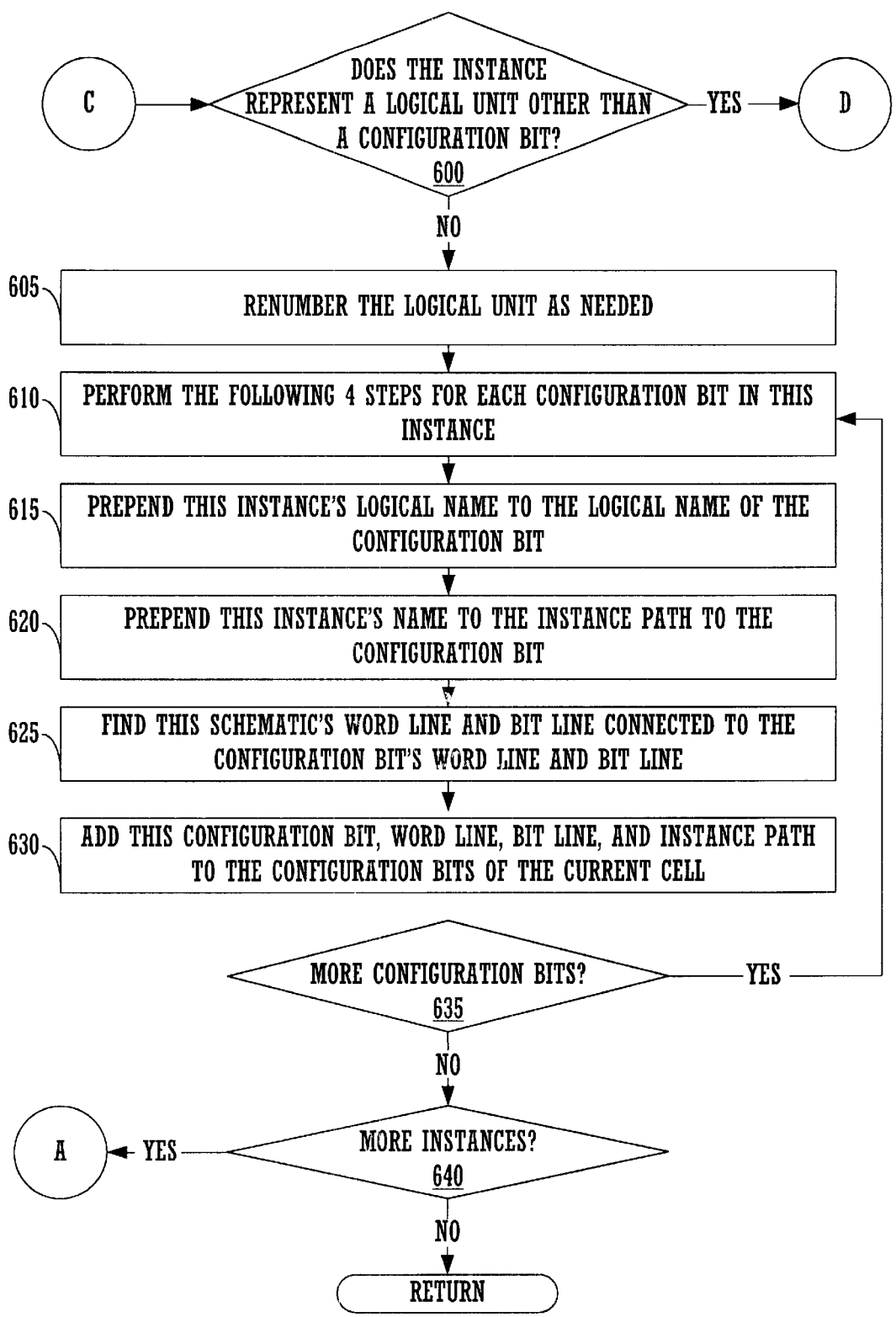
Figure 4D:
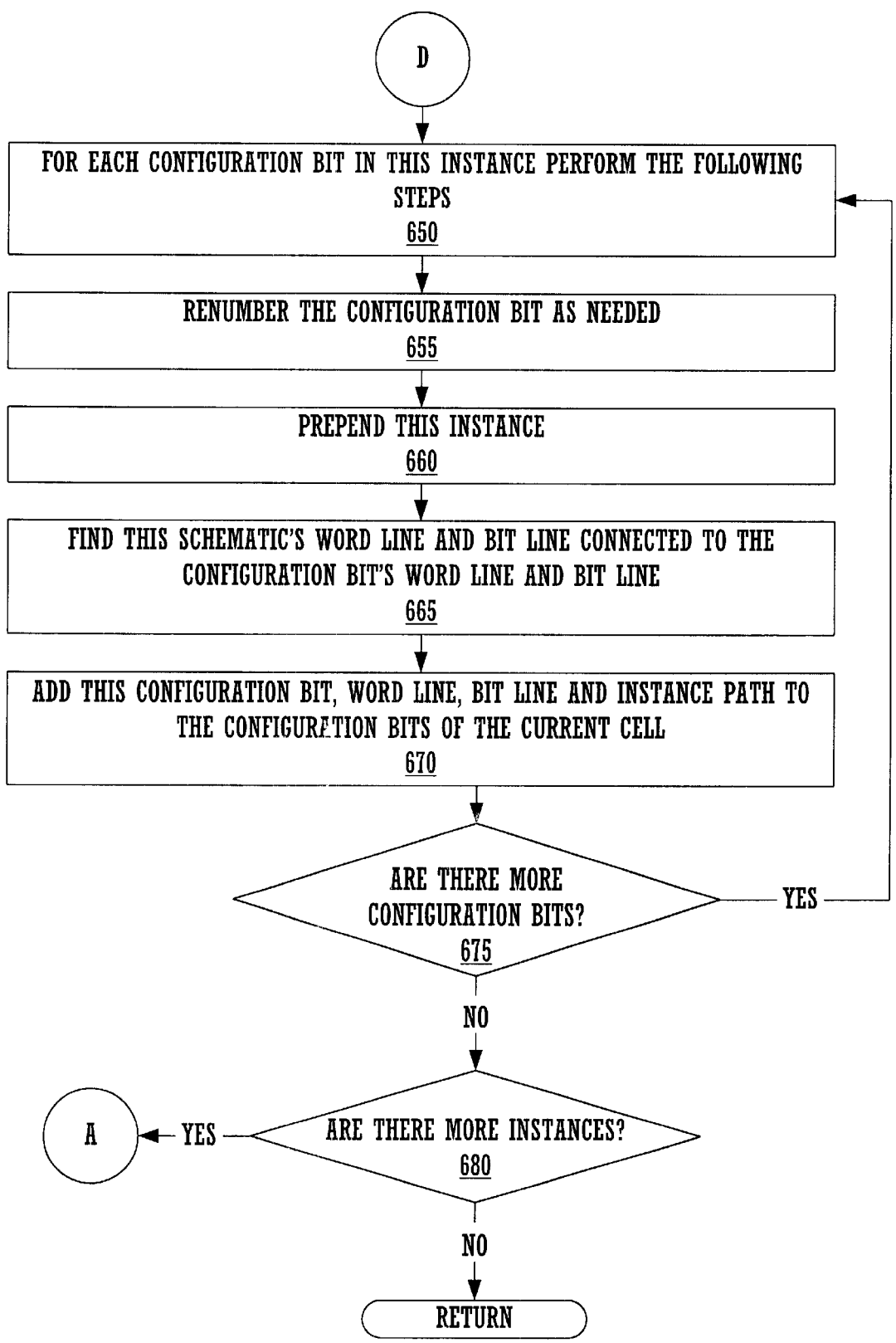

Next, in step 530, the process determines if all types of cells 230 which were instantiated in the schematic of the cell 230 passed into the function have been processed. If not, the process 500 repeats until they have been processed. Then, in step 535 all of the instances that are connected to the wordlines and bitlines which were passed in are sorted alphanumerically. After this step, process 500 is identical to process 300 and process 500 goes through the steps of FIGS. 4B though 4D. Thus, the description of steps 545–680 in FIGS. 4B–4D is analogous to the description for steps 345–480 in FIGS. 3B–3D.

The following is exemplary pseudocode for the process 500 from FIGS. 4A–4D.

```
function findConfigBitsKnowingWlBl (cell wordLines
    bitLines)
    open the schematic for the cell
    find all of the instances that are connected to the word-
        Lines and bitLines
    for each type of cell instantiated in the schematic con-
            nected to wordLines and bitLines
        if it has not yet found the configuration bits for the cell
                that is instantiated
            recursively call findConfigBitsKnowingW1B1 for
                the cell that is instantiated
        end if
    end for each
    sort all of the instances connected to wordLines and
        bitLines by instance name with an alphanumeric sort
``` from this point the pseudocode is identical to the pseudocode for process 300 picking up with "for each instance in sorted order"

Configuration Block Definition File

The configuration block definition file will provide the most basic information for each configuration block type. Each line will list the configuration block logical name, the database library name, cell name, and view name, and word line terminal name and bit line terminal name. The word line terminal name and bit line terminal name determine the order in which the config bits are shifted into the CPLD for each configuration block. For example:

lines that begin with # are comments
libName cellName viewName wlTermName blTerm-
    Name logicalUnitName
c39cl c39cl_core schematic cfgwl<187:0> cfgbl<0:421>
    cl
c39cr c39cr_marray schematic wlAss<0:31>
    blAss<0:255> cr
c39cm c39cm_marray schematic wlAss<0:31>
    blAss<0:127> cm The word line and bit line terminal names determine the order in which the bits are shifted into the part. With this configuration line, the cluster (cl) will shift in its configuration bits 235 in the order:

cfgwl<187>, cfgbl<0>
cfgwl<187>, cfgbl<1>
. . .
cfgwl<187>, cfgbl<421>
cfgwl<186>, cfgbl<0>
cfgwl<186>, cfgbl<1>
. . .
cfgwl<0>, cfgbl<421>

Bitstream

The bitstream is an ASCII file with the settings for the configuration bits 235. There will be only '1' and '0' characters in the bitstream; there will not be any spaces or carriage returns or comments. In one embodiment, a bitstream must be comprised of whole configuration blocks.

Figure 5:
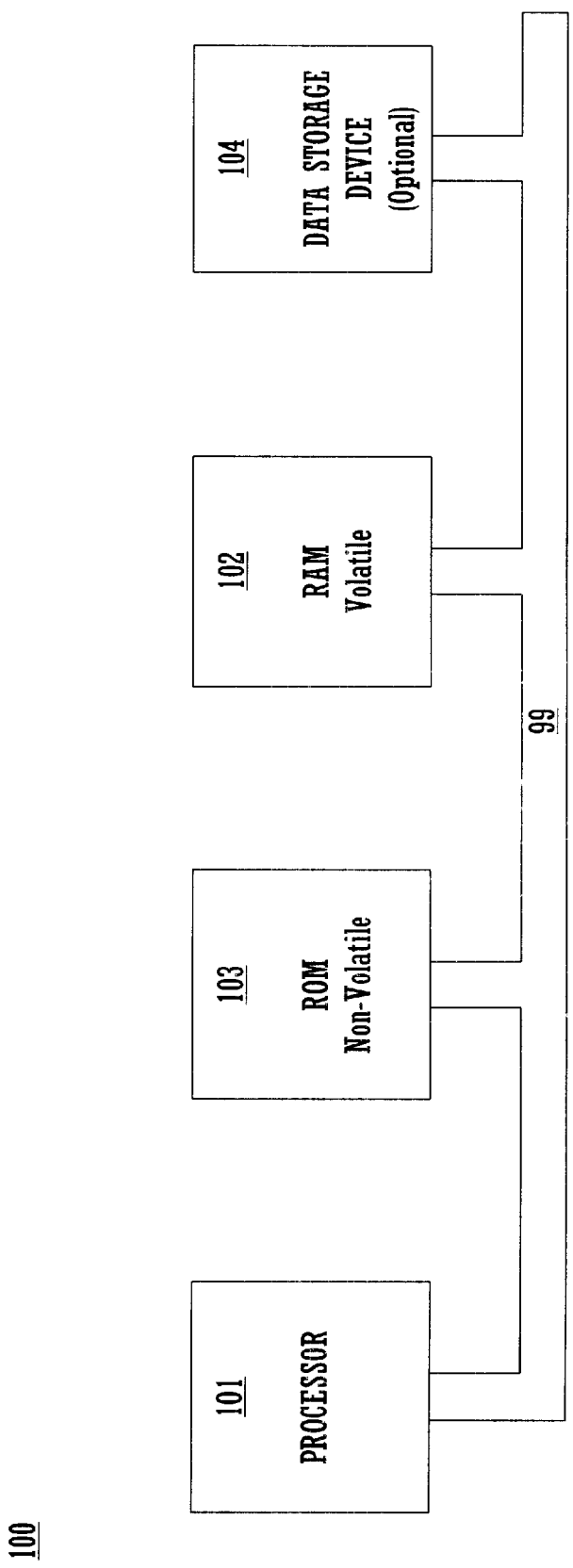
FIG. 5 is a block diagram of a computer system, which may be used as a platform to implement embodiments of the present invention.

FIG. 5 illustrates circuitry of computer system 100, which may form a platform for embodiments of the present invention. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 coupled with the bus 99 for storing information and instructions.

The preferred embodiment of the present invention, a method and system for automatically identifying configuration bit address in a schematic hierarchy, is thus described. While the present invention has been described in particular embodiments, it should be appreciated that the present invention should not be construed as limited by such embodiments, but rather construed according to the below claims.

What is claimed is:

1. A computer implemented method of determining addresses of configuration cells in a schematic hierarchy of a circuit design comprising the steps of:
    a) accessing said schematic hierarchy of said circuit design;
    b) automatically traversing said schematic hierarchy to identify a configuration cell;
    c) automatically determining an address for said configuration cell;
    d) automatically determining a unique name for said configuration cell including a hierarchical logical name and a schematic path name;
    e) automatically associating and storing said name and said address of said configuration cell within a data structure within computer readable memory; and
    f) repeating said steps b)–e) for each configuration cell of said schematic hierarchy.

2. The method of claim 1 wherein step c) comprises the steps of:
    c1) automatically determining a wordline associated with said configuration cell; and
    c2) automatically determining a bitline associated with said configuration cell.

3. The method of claim 1 wherein step b) comprises the step of:
    b1) automatically traversing said schematic hierarchy to identify a configuration cell which is at the lowest level in said schematic hierarchy.

4. The method of claim 1 further comprising the step of:
    d) determining a schematic path name for said configuration cell, wherein said schematic path name specifies a path from a first point in said schematic hierarchy to said configuration cell.

5. The method of claim 1 further comprising the step of:
    g) sorting alphanumerically a list of instance names in said schematic hierarchy.

6. The method of claim 1 further comprising the step of:
    g) renumbering a numerical index associated with said configuration cell.

7. The method of claim 1 further comprising the step of:
    g) determining whether an instance name represents a configuration cell by comparing said instance name with a list of logical unit names.

8. The method of claim 1 further comprising the steps:
    g) determining that an instance name represents a logical unit which is not a configuration cell; and
    h) prepending said instance name to said hierarchical logical name of said configuration cell.

9. The method of claim 1 further comprising the steps of:
    g) determining that an instance name represents a logical unit which is not a configuration cell; and
    h) tracing the connection of a wordline of said configuration cell to a higher level cell of said schematic hierarchy.

10. The method of claim 1 wherein said schematic hierarchy is of a complex programmable logic device (CPLD).

11. A system comprising a processor coupled to a bus and memory coupled to said bus wherein said memory contains processor instructions for implementing a method of determining addresses of configuration cells in a schematic hierarchy of a circuit design, said method comprising the steps of:
    a) accessing said schematic hierarchy of said circuit design;
    b) automatically traversing said schematic hierarchy to identify a configuration cell;
    c) automatically determining an address for said configuration cell;
    d) automatically determining a unique name for said configuration cell including a hierarchical logical name and a schematic path name;
    e) automatically associating and storing said name and said address of said configuration cell within a data structure within said memory; and
    f) repeating said steps b)–e) for each configuration cell of said schematic hierarchy.

12. The method of claim 11 wherein step c) comprises the steps of:
    c1) automatically determining a wordline associated with said configuration cell; and
    c2) automatically determining a bitline associated with said configuration cell.

13. The method of claim 11 wherein step b) comprises the step of:
    b1) automatically traversing said schematic hierarchy to identify a configuration cell which is at the lowest level in said schematic hierarchy.

14. The method of claim 11 further comprising the step of:
    g) determining whether an instance name represents a configuration cell by comparing said instance name with a list of logical unit names.

15. The method of claim 11 further comprising the steps:
    g) determining that an instance name represents a logical unit which is not a configuration cell; and
    h) prepending said instance name to said schematic path name of said configuration cell.

16. The method of claim 11 wherein said schematic hierarchy is of a complex programmable logic device (CPLD).

17. A computer implemented method of determining addresses of configuration bits in a schematic hierarchy of a circuit design comprising the steps of:
    a) accessing said schematic hierarchy of said circuit design;
    b) automatically traversing a selected portion of said schematic hierarchy to identify a configuration bit;
    c) automatically determining an address for said configuration bit;
    d) automatically determining a unique name for said configuration bit including a hierarchical logical name and a schematic path name;

e) automatically associating and storing said name and said address of said configuration bit within a data structure within computer readable memory; and f) repeating said steps b)–e) for each configuration bit of said selected portion of said schematic hierarchy.

18. The method of claim 17 wherein step c) comprises the steps of:

c1) automatically determining a wordline associated with said configuration bit; and c2) automatically determining a bitline associated with said configuration bit.

19. The method of claim 17 wherein step b) comprises the step of:

b1) automatically traversing said selected portion of said schematic hierarchy to identify a configuration cell which is at the lowest level in said schematic hierarchy.

20. The method of claim 17 further comprising the step of:

g) renumbering a numerical index associated with said configuration bit.

* * * * *